United States Patent
Park et al.

(10) Patent No.: US 11,522,159 B2
(45) Date of Patent: Dec. 6, 2022

(54) PROTECTION FILM FOR WINDOW OF DISPLAY DEVICE

(71) Applicant: SAMSUNG DISPLAY CO., LTD., Yongin-si (KR)

(72) Inventors: Soonsung Park, Asan-si (KR); Jeongjin Kim, Cheonan-si (KR); Jooil Kim, Cheonan-si (KR); Dohyeon Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/512,012

(22) Filed: Jul. 15, 2019

(65) Prior Publication Data
US 2020/0099010 A1 Mar. 26, 2020

(30) Foreign Application Priority Data
Sep. 21, 2018 (KR) .......................... 10-2018-0113561

(51) Int. Cl.
*H01L 51/52* (2006.01)
*B32B 17/10* (2006.01)

(52) U.S. Cl.
CPC ...... *H01L 51/5253* (2013.01); *B32B 17/1033* (2013.01); *B32B 2367/00* (2013.01)

(58) Field of Classification Search
None
See application file for complete search history.

(56) References Cited

U.S. PATENT DOCUMENTS

| | | | |
|---|---|---|---|
| 2009/0181242 A1 | 7/2009 | Enniss et al. | |
| 2012/0164394 A1* | 6/2012 | Lee | C09J 7/29 428/189 |
| 2013/0242522 A1* | 9/2013 | Yoo | H05K 5/0017 361/807 |
| 2015/0049287 A1* | 2/2015 | Chang | G02F 1/133512 349/110 |
| 2016/0179139 A1* | 6/2016 | Ahn | G06F 1/1686 361/679.3 |
| 2016/0190510 A1* | 6/2016 | Li | H01L 51/524 156/267 |
| 2016/0357294 A1* | 12/2016 | Ozeki | B32B 17/06 |
| 2017/0059875 A1* | 3/2017 | Seung | G02B 1/14 |
| 2017/0088749 A1* | 3/2017 | Tsuchida | G09F 9/00 |

FOREIGN PATENT DOCUMENTS

| | | |
|---|---|---|
| KR | 10-1207514 | 12/2012 |
| KR | 10-1748426 | 6/2017 |
| KR | 10-1806038 | 12/2017 |

\* cited by examiner

*Primary Examiner* — Khaja Ahmad
(74) *Attorney, Agent, or Firm* — Lewis Roca Rothgerber Christie LLP

(57) ABSTRACT

A protection film for a window of a display device is capable of preventing or substantially preventing damage to a securing unit of the window. A protection film for a window of a display device includes: a protection layer; and a barrier wall on the protection layer, the protection layer having a groove at an edge of the protection layer.

10 Claims, 20 Drawing Sheets

PROTECTION FILM FOR WINDOW OF DISPLAY DEVICE

CROSS-REFERENCE TO RELATED APPLICATION

This application claims priority to and the benefit of Korean Patent Application No. 10-2018-0113561, filed on Sep. 21, 2018 in the Korean Intellectual Property Office (KIPO), the entire disclosure of which is incorporated by reference herein.

BACKGROUND

1. Field

Aspects of embodiments of the present invention relate to a protection film.

2. Discussion of Related Art

A window of a display device is protected by a protection film. Such windows may be stored in a storage box. In such a case, there may occur a problem that a securing unit of the window is damaged due to interference between the securing unit and the protection film for the windows that are adjacent to each other.

It is to be understood that this background of the technology portion is intended to provide useful background for understanding the technology and, as such, disclosed herein, the technology background portion may include ideas, concepts, or recognitions that were not part of what was known or appreciated by those skilled in the pertinent art prior to a corresponding effective filing date of subject matter disclosed herein.

SUMMARY

According to an aspect of embodiments of the present invention, a protection film for a window of a display device may prevent or substantially prevent damage to a securing unit of the window.

According to one or more embodiments, a protection film for a window of a display device includes: a protection layer; and a barrier wall on the protection layer, and the protection layer has a groove at an edge of the protection layer.

The edge of the protection layer may include an inner edge defining the groove, and an outer edge, and the barrier wall may be disposed along the outer edge of the protection layer.

The barrier wall may be further disposed along the inner edge.

The barrier wall may have a closed-loop shape that encloses a center portion of the protection layer.

The protection layer may further include at least one dummy layer extending from the inner edge of the protection layer and disposed at the groove.

The groove may have a U-like shape or a trapezoidal shape.

The groove may be disposed at the edge of the protection layer, corresponding to a securing unit of the window of the display device.

The protection film may further include a handle extending from the barrier wall outwardly of the protection film.

The protection film may further include an adhesive layer on the protection layer.

A portion of the adhesive layer may be disposed between the protection layer and the barrier wall.

According to one or more embodiments, a protection film for a window of a display device includes: a protection layer; and a barrier wall on the protection layer, and the barrier wall includes a first barrier wall and a second barrier wall having a thickness greater than a thickness of the first barrier wall.

The second barrier wall may be disposed on the protection layer, corresponding to a securing unit of the window of the display device.

The thickness of the second barrier wall may be greater than a size of a securing groove of the securing unit.

The barrier wall may have a closed-loop shape that encloses a center portion of the protection layer.

According to one or more embodiments, a protection film for a window of a display device includes: a protection layer; and a spacer protruding from the protection layer, and a height of the spacer is higher than a height of a securing unit of the window of the display device.

The spacer may be disposed in an oblique direction.

The spacer may be adjacent to the securing unit of the window.

The foregoing is illustrative only and is not intended to be in any way limiting of the present invention. In addition to the illustrative aspects, embodiments, and features described above, further aspects, embodiments, and features will become apparent by reference to the drawings and the following detailed description.

BRIEF DESCRIPTION OF THE DRAWINGS

Aspects and features of the present invention will become more apparent by describing in further detail some embodiments thereof with reference to the accompanying drawings, wherein.

DETAILED DESCRIPTION

Figure 1:
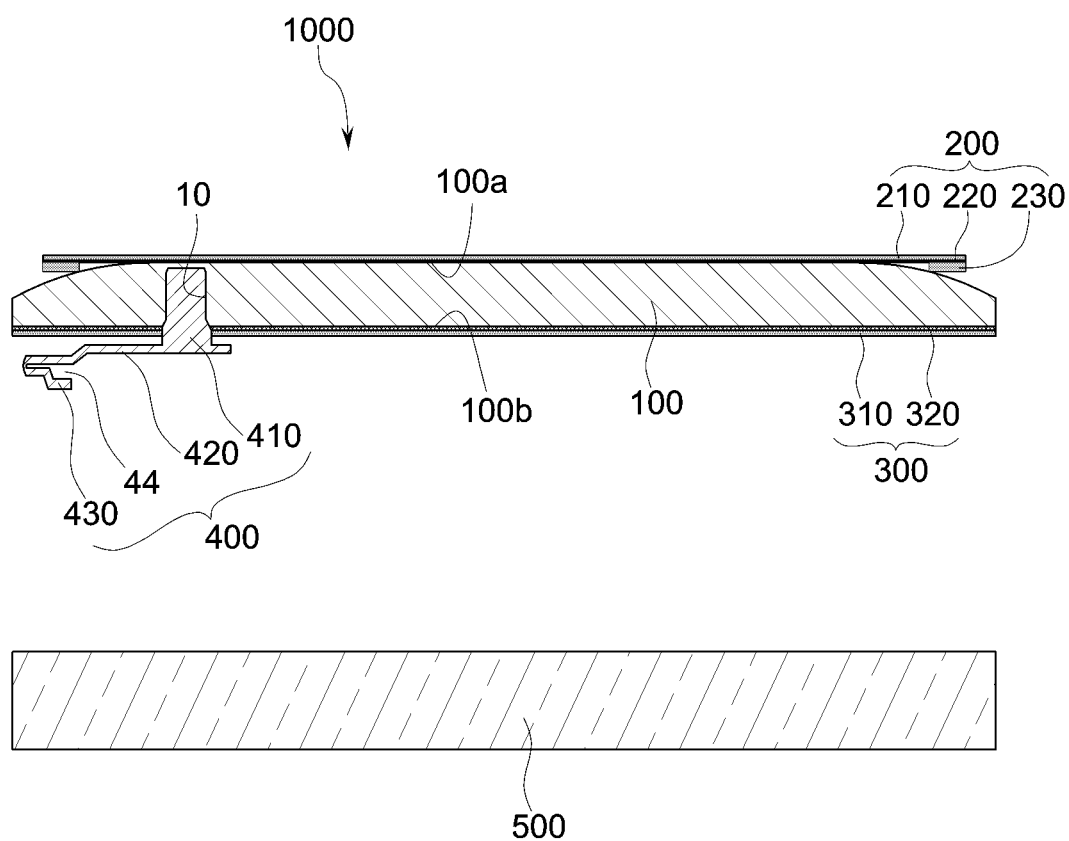
FIG. 1 is a cross-sectional view illustrating a display device according to an embodiment.

Embodiments will now be described more fully herein with reference to the accompanying drawings. Although the present invention may be modified in various manners and have several embodiments, some embodiments are illustrated in the accompanying drawings and will be mainly described in the specification. However, the scope of the present invention is not limited to the embodiments shown and should be construed as including all changes, equivalents, and substitutions included in the spirit and scope of the invention.

In the drawings, thicknesses of layers and areas may be illustrated in an enlarged manner for clarity and ease of description thereof. When a layer, area, or plate is referred to as being "on" another layer, area, or plate, it may be directly on the other layer, area, or plate, or one or more intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or one or more intervening layers, areas, or plates may be present therebetween. Conversely, when a layer, area, or plate is referred to as being "directly below" another layer, area, or plate, intervening layers, areas, or plates may be absent therebetween.

The spatially relative terms "below," "beneath," "lower," "above," "upper," or the like, may be used herein for ease of description to describe relations between one element or component and another element or component as illustrated in the drawings. It is to be understood that the spatially relative terms are intended to encompass different orientations of the device in use or operation, in addition to the orientation depicted in the drawings. For example, in a case in which a device illustrated in the drawing is turned over, the device positioned "below" or "beneath" another device may be placed "above" another device. Accordingly, the illustrative term "below" may include both the lower and upper positions. The device may also be oriented in the other direction and, thus, the spatially relative terms may be interpreted differently depending on the orientations.

Throughout the specification, when an element is referred to as being "connected" to another element, the element may be directly connected to the other element, or electrically connected to the other element with one or more intervening elements interposed therebetween. It is to be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It is to be understood that, although the terms "first," "second," "third," or the like may be used herein to describe various elements, these elements should not be limited by these terms. These terms are used to distinguish one element from another element. Thus, a "first" element discussed below could be termed a "second" element or a "third" element, and a "second" element and a "third" element may be termed likewise without departing from the teachings herein.

"About" or "approximately," as used herein, are inclusive of the stated value and mean within an acceptable range of variation for the particular value as determined by one of ordinary skill in the art, considering the measurement in question and the error associated with measurement of the particular quantity (i.e., the limitations of the measurement system). For example, "about" may mean within one or more standard variations, or within ±30%, 20%, 10%, or 5% of the stated value.

Unless otherwise defined, all terms used herein (including technical and scientific terms) have the same meaning as commonly understood by those skilled in the art to which this invention pertains. It is to be further understood that terms, such as those defined in commonly used dictionaries, should be interpreted as having a meaning that is consistent with their meaning in the context of the relevant art and are not to be interpreted in an ideal or excessively formal sense unless clearly defined in the present specification.

Some parts which are not associated with the description may not be provided in order to specifically describe embodiments of the present invention, and like reference numerals refer to like elements throughout the specification.

Herein, a protection film for a window according to some embodiments will be described with reference to FIGS. 1 to 22

FIG. 1 is a cross-sectional view illustrating a display device according to an embodiment.

A display device 1000 according to an embodiment includes a display module 500 and a window 100, as illustrated in FIG. 1. The display module 500 and the window 100 are located facing each other.

The display module 500 may include a display panel, a driving circuit unit for driving the display panel, and a case for accommodating and protecting such elements (i.e., the display panel and the driving circuit unit).

The display panel may include a first substrate, a second substrate facing the first substrate, and a display element disposed at a pixel region between the first substrate and the second substrate.

A plurality of gate lines, a plurality of data lines, and a plurality of thin film transistors may be disposed at the first substrate.

The display element may include liquid crystals or a light emitting diode ("LED") (e.g., an organic light emitting diode ("OLED")), for example. In a case in which the display element includes liquid crystals, the display module 500 may further include a backlight unit for providing light to the display panel.

In an embodiment, an edge of the window 100 has a rounded shape (or a curved shape). The window 100 includes an outer surface 100a and an inner surface 100b that face each other, and an edge of the outer surface 100*a* may have a rounded shape. In such an embodiment, the inner surface 100*b* of the window 100 means a surface that faces the display module 500, and the outer surface 100*a* of the window 100 means a surface that is located on the opposite side of the inner surface 100*b* of the window 100.

The window 100 is coupled to the display module 500. For example, the window 100 may be coupled to the case of the display module 500 such that the inner surface 100*b* of the window 100 faces the display module 500. In an embodiment, a securing unit 400 is disposed at the inner surface 100*b* of the window 100, and the window 100 may be secured to the case of the display module 500 by the securing unit 400.

In an embodiment, the securing unit 400 includes a support portion 410, an extension portion 420, and a fastening portion 430. In an embodiment, the support portion 410 is inserted into an insertion groove 10 of the inner surface 100*b* of the window 100, the extension portion 420 extends from the support portion 410, and the fastening portion 430 is bent from the extension portion 420, and faces the extension portion 420. A securing groove 44 is located between the extension portion 420 and the fastening portion 430.

An inner protection film 300 is located at the inner surface 100*b* of the window 100, and an outer protection film 200 is located at the outer surface 100*a* of the window 100. The inner protection film 300 is removed before a process of coupling the window 100 and the display module 500. Then, after the window 100 and the display module 500 are coupled to each other, the outer protection film 200 is removed. After the outer protection film 200 is removed, an additional protection film may be further disposed at the outer surface 100*a* of the window 100.

The inner protection film 300 includes a protection layer 310 and an adhesive layer 320 on the protection layer 310. The inner protection film 300 may be attached to the inner surface 100*b* of the window 100 through the use of the adhesive layer 320.

The outer protection film 200 includes a protection layer 210, an adhesive layer 220, and a barrier wall 230. The adhesive layer 220 is disposed on the protection layer 210. The barrier wall 230 is disposed on the adhesive layer 220. In such an embodiment, the barrier wall 230 is disposed at an edge of the adhesive layer 220. The outer protection film 200 may be attached to the outer surface 100*a* of the window 100 through the use of the adhesive layer 220.

In an embodiment, since the edge of the outer surface 100*a* has a rounded shape, an edge of the outer protection film 200 may not be easily attached to the edge of the outer surface 100*a*. This may cause a problem that the edge of the outer protection film 200 may be detached. In such a case, foreign matter from the outside may easily permeate into an interface or space between the outer protection film 200 and the outer surface 100*a* of the window 100, and, thus, adhesion between the outer protection film 200 and the window 100 may be weakened. The aforementioned barrier wall 230 may prevent or substantially prevent foreign matter from the outside from infiltrating into the interface. That is, the barrier wall 230 may prevent or substantially prevent the edge of the outer protection film 200 that has failed to be attached to the outer surface 100*a* of the window 100 from being exposed to the outside.

Figure 2:
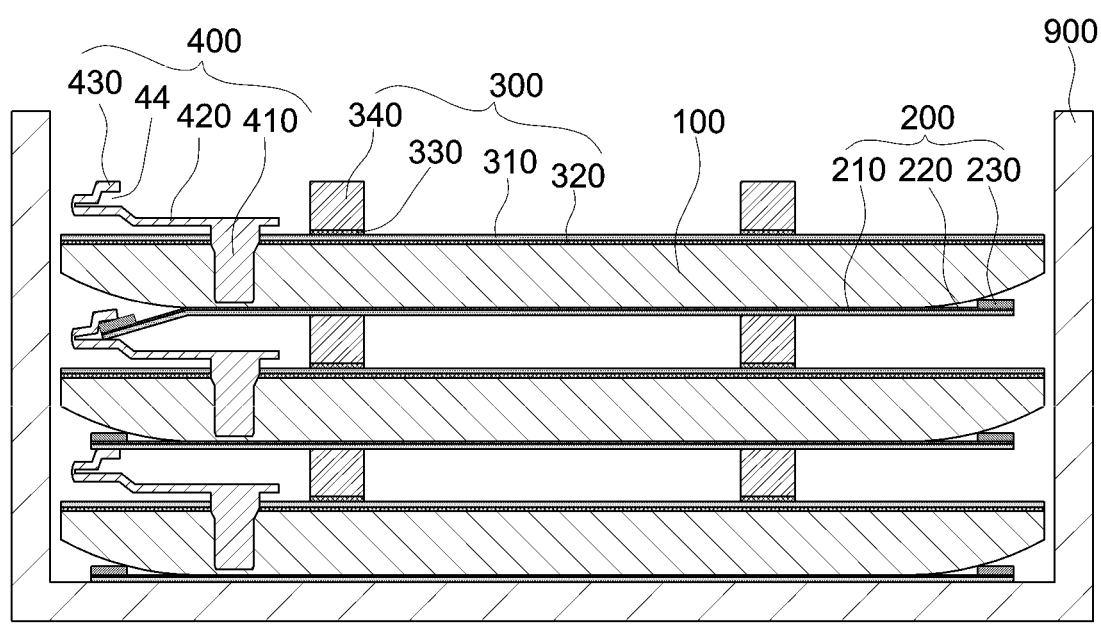
FIG. 2 is a view illustrating a plurality of windows stored in a storage box.

FIG. 2 is a view illustrating a plurality of windows 100 stored in a storage box 900.

As illustrated in FIG. 2, the plurality of windows 100 may be vertically stacked in the storage box 900 to be stored therein. Each of the windows 100 of FIG. 2 may be substantially the same as the window 100 of FIG. 1 described above.

The windows 100 of FIG. 2 are disposed in the storage box 900 such that the outer surface 100*a* of the window 100 faces a bottom surface of the storage box 900. At least one spacer 340 is disposed between adjacent ones of the windows 100. The spacer 340 keeps intervals between adjacent ones of the windows 100 constant such that the adjacent ones of the windows 100 do not contact each other.

In an embodiment, the spacer 340 may be an element that is included in the inner protection film 300. The spacer 340 may be attached to the protection layer 310 of the inner protection film 300. To this end, an adhesive layer 330 may be disposed between the spacer 340 and the protection layer 310 of the inner protection film 300. As such, the inner protection film 300 may include the protection layer 310, two adhesive layers 320 and 330, and the spacer 340.

When the window 100 and the display module 500 are coupled to each other, the windows 100 are loaded sequentially from a window 100 that is located at an uppermost portion of the storage box 900. For example, the window 100 that is located at an uppermost portion of the storage box 900 may be attached to a vacuum absorber and lifted vertically to be transferred to a subsequent process equipment.

As illustrated in FIG. 2, since the windows 100 are stored in a state in which the outer protection film 200 and the inner protection film 300 are attached to or in contact with each other, the outer protection film 200 of one of the windows 100 and a securing unit 400 of another of the windows 100 that is adjacent to the one of the windows 100 face each other. Accordingly, the outer protection film 200 of the window 100 that is located at an upper side and the securing unit 400 of the window 100 that is located at a lower side may interfere with each other during a process for storing the windows 100. For example, when defining the windows 100 of FIG. 2 as first, second, and third windows in order from a lowermost one of the windows 100, the barrier wall 230 of the third window may be inserted into the securing groove 44 of the second window. In such a state, when the third window is lifted, friction may be generated between the barrier wall 230 of the outer protection film 200 that is attached to the third window and the securing unit 400 of the inner protection film 300 that is attached to the second window, and, thus, the securing unit 400 may be damaged. For example, the securing unit 400 of the second window may be lifted up along the barrier wall 230 of the third window, and a part of the securing unit 400 may be made crooked, or a size of the securing groove 44 may be changed. Then, the window 100 and the display module 500 may not be firmly coupled to each other.

Figure 3:
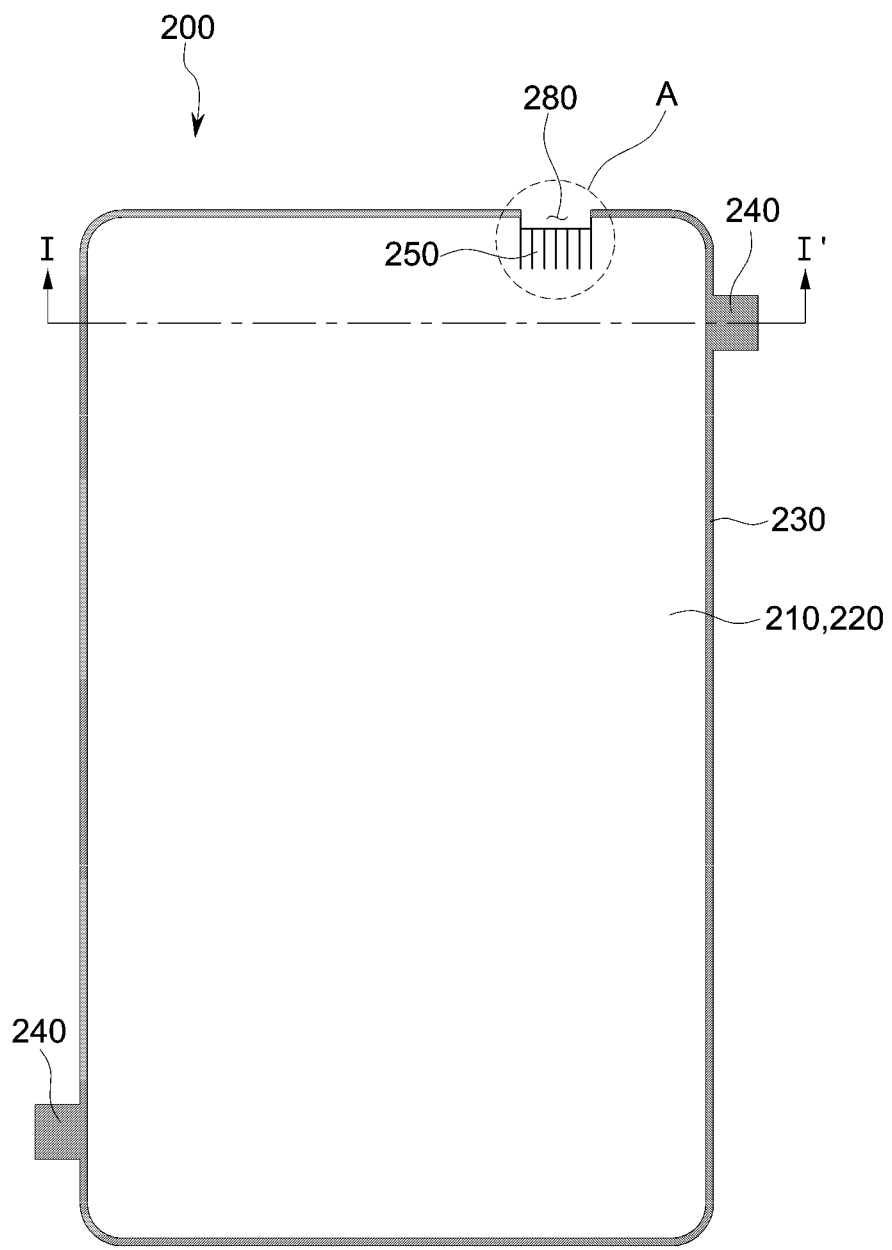
FIG. 3 is a plan view illustrating an outer protection film according to an embodiment.
Figure 4:
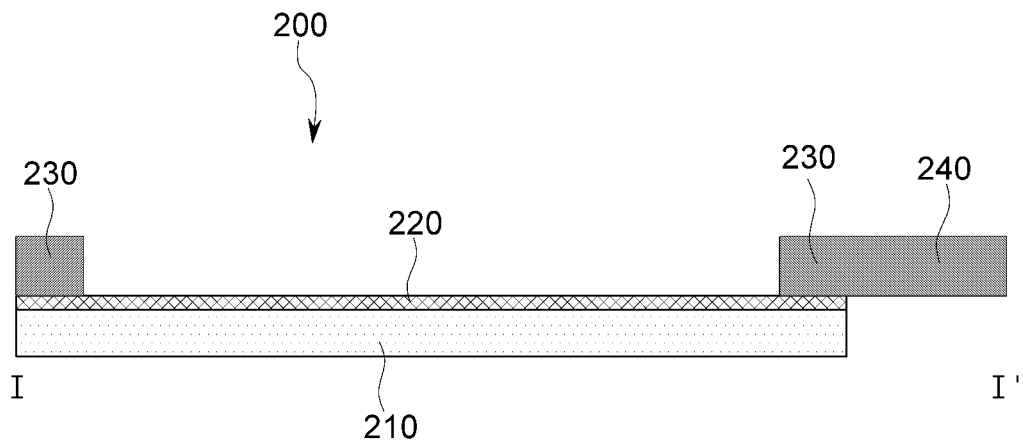
FIG. 4 is a cross-sectional view taken along the line I-I' in FIG. 3.
Figure 5:
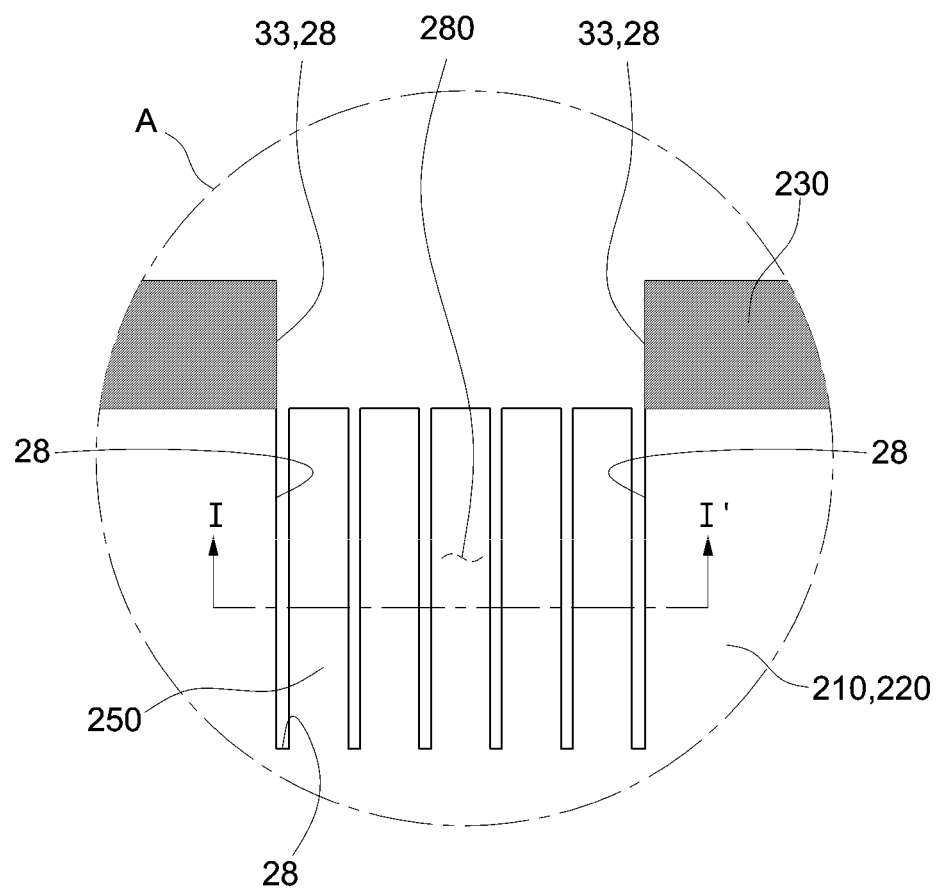
FIG. 5 is an enlarged view illustrating a region "A" in FIG. 3.
Figure 6:
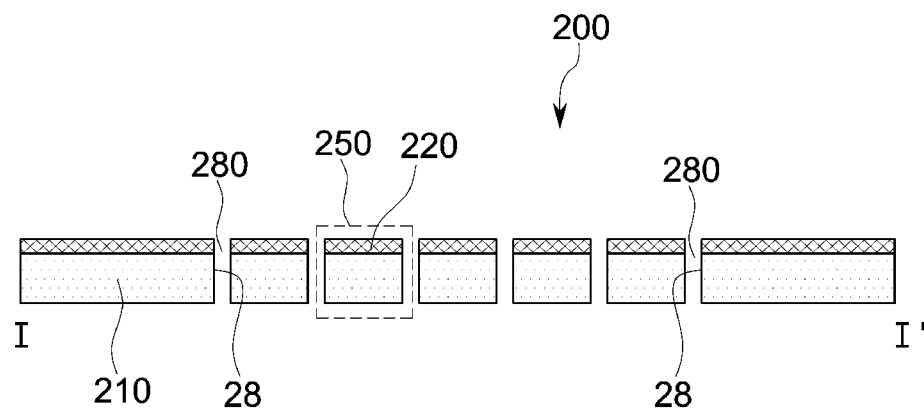
FIG. 6 is a cross-sectional view taken along the line I-I' in FIG. 5.

FIG. 3 is a plan view illustrating an outer protection film 200 according to an embodiment; FIG. 4 is a cross-sectional view taken along the line I-I' in FIG. 3; FIG. 5 is an enlarged view illustrating a region "A" in FIG. 3; and FIG. 6 is a cross-sectional view taken along the line I-I" in FIG. 5.

The outer protection film 200 according to an embodiment includes a protection layer 210, an adhesive layer 220, a barrier wall 230, and a handle 240, as illustrated in FIGS. 3 to 6.

In an embodiment, the protection layer 210 may include a material that includes a polyethylene terephthalate resin.

The protection layer 210 has a groove 280, as illustrated in FIGS. 3 and 5. The groove 280 of the protection layer 210 may be defined by an inner edge 28 of the protection layer 210. That is, a part of an edge of the protection layer 210 that surrounds the groove 280 may be defined as the inner edge 28. In an embodiment, another part of the edge of the protection layer 210, other than the inner edge 28, may be defined as an outer edge of the protection layer 210.

In an embodiment, at least one dummy layer 250 is located at the groove 280 of the protection layer 210. One side of the dummy layer 250 is connected to the protection layer 210. The dummy layer 250 and the protection layer 210 are integrally formed into a unitary structure.

The dummy layer 250 extends from the inner edge 28 of the protection layer 210 that defines the groove 280. For example, the dummy layer 250 extends from a portion of the inner edge 28, located opposite to an opening of the groove 280, toward the opening of the groove 280. As illustrated in an example illustrated in FIG. 5, a plurality of dummy layers 250 that are separated from each other may be arranged at regular intervals in the groove 280. One side of each of the plurality of dummy layers 250 is connected to the protection layer 210.

The groove 280 and the dummy layers 250 are located corresponding to the securing unit 400 of the window 100. Since only one side of the dummy layer 250 is connected to the protection layer 210, the dummy layer 250 is easily deformed by an externally applied force. That is, the dummy layer 250 may be easily made crooked according to a force externally applied thereto. Accordingly, the dummy layer 250 of the outer protection film 200 that is attached to the aforementioned third window may be easily made crooked even if it is inserted into the securing groove 44 of the securing unit 400 of the second window. That is, even if the third window is lifted up in a state in which the dummy layer 250 is inserted into the securing groove 44, the dummy layer 250 is made crooked, and the securing unit 400 is not damaged.

The adhesive layer 220 is disposed on the protection layer 210 and the dummy layer 250. In an embodiment, for example, the adhesive layer 220 is disposed on the protection layer 210 and the dummy layer 250, overlapping an entire area of the protection layer 210 and an entire area of the dummy layer 250. An area of the adhesive layer 220 may be substantially equal to a sum of an area of the protection layer 210 and an area of the dummy layer 250. The adhesive layer 220 may have a shape substantially the same as an overall shape of the protection layer 210 and the dummy layer 250. For example, the shape of the adhesive layer 220 may be substantially the same as a shape of a structure that includes the protection layer 210 and the dummy layer 250.

The barrier wall 230 is disposed on the adhesive layer 220. For example, the barrier wall 230 may be disposed at an edge of the adhesive layer 220, as illustrated in FIGS. 3 and 4. In an embodiment, the barrier wall 230 overlaps the edge of the adhesive layer 220 and an edge of the protection layer 210.

In an embodiment, the barrier wall 230 is not disposed at a portion of the edge of the protection layer 210 that overlaps the securing unit 400 of the window 100. For example, as illustrated in FIG. 5, the barrier wall 230 has a shape that is cut out with the groove 280 of the protection layer 210 therebetween. End portions 33 of the barrier wall 230 face each other with the groove 280 therebetween. In other words, the barrier wall 230 may be disposed along the outer edge of the protection layer 210. As such, as a part of the barrier wall 230 that corresponds to the securing unit 400 is removed, interference between the barrier wall 230 and the securing unit 400 may be prevented or substantially minimized. Accordingly, damage to the securing unit 400 of the window 100 may be prevented or substantially prevented.

In an embodiment, the outer protection film 200 attached to the window 100 may be removed through the use of the handle 240. For example, an operator may remove the outer protection film 200 by pulling the handle 240 while holding the handle 240 of the outer protection film 200 by hand.

Figure 7:
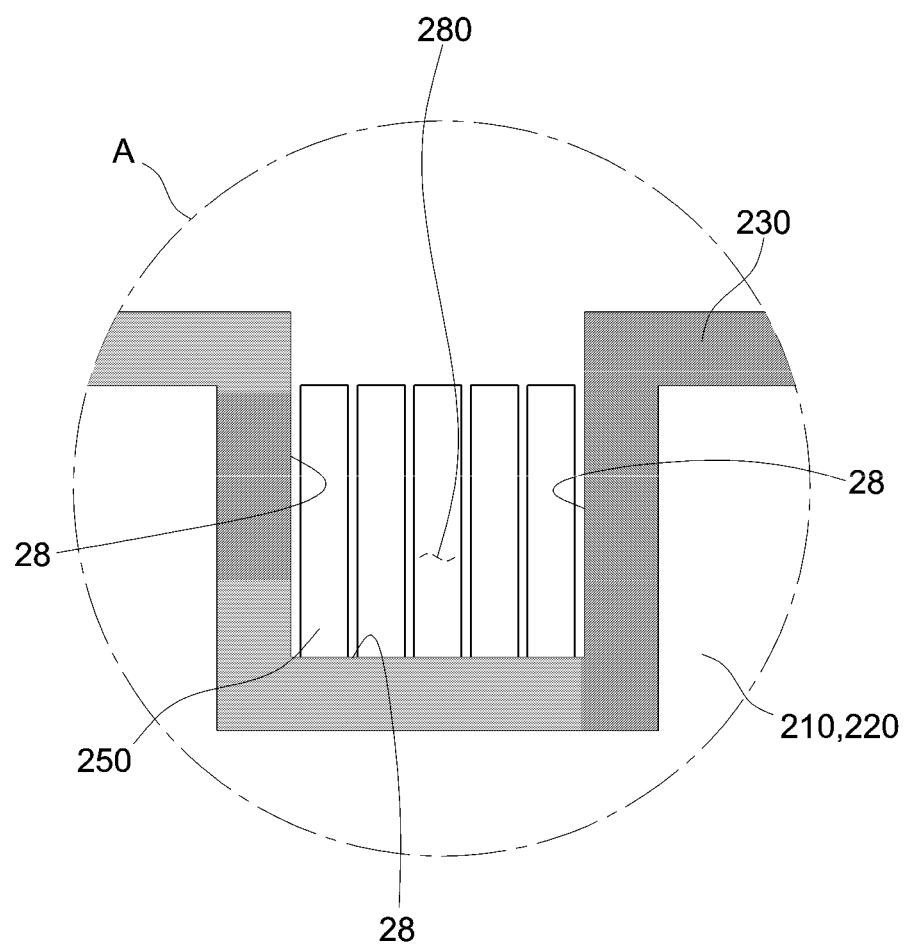
FIG. 7 is an enlarged view illustrating a region corresponding to the region "A" in FIG. 3, according to another embodiment.

FIG. 7 is an enlarged view illustrating a region corresponding to the region "A" in FIG. 3, according to another embodiment.

As illustrated in FIG. 7, in an embodiment, a barrier wall 230 may be disposed along an inner edge 28 that defines a groove 280 of a protection layer 210, in addition to an outer edge of the protection layer 210. In other words, the barrier wall 230 may be disposed along the outer edge and the inner edge of the protection layer 210. Such a barrier wall 230 may have a closed-loop shape. When the barrier wall 230 has a closed-loop shape, foreign matter from the outside may be blocked more effectively.

Figure 8:
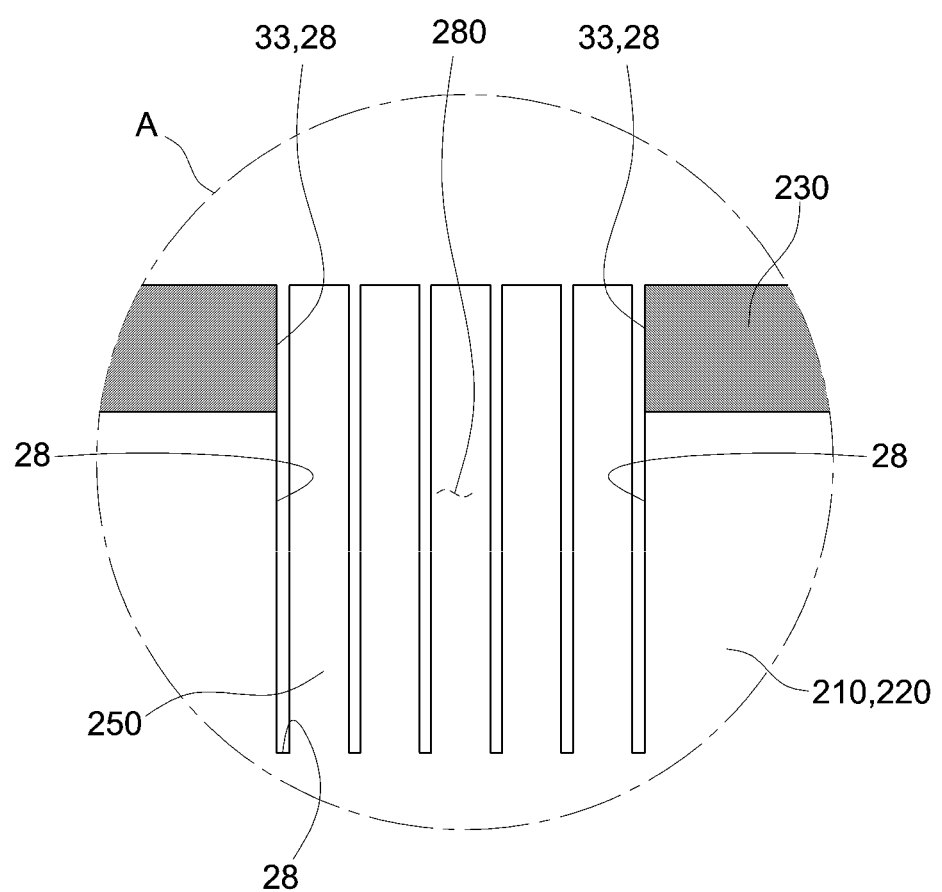
FIG. 8 is an enlarged view illustrating a region corresponding to the region "A" in FIG. 3, according to another embodiment.

FIG. 8 is an enlarged view illustrating a region corresponding to the region "A" in FIG. 3, according to another embodiment.

In an embodiment, dummy layers 250 may be disposed between end portions 33 of a barrier wall 230 that face each other, as illustrated in FIG. 8. In other words, the dummy layers 250 may further extend into a space between the end portions 33 of the barrier wall 230.

In an embodiment, although not illustrated, the aforementioned dummy layers 250 illustrated in FIG. 7 may also further extend into the space between the end portions 33 of the barrier wall 230 that face each other.

Figure 9:
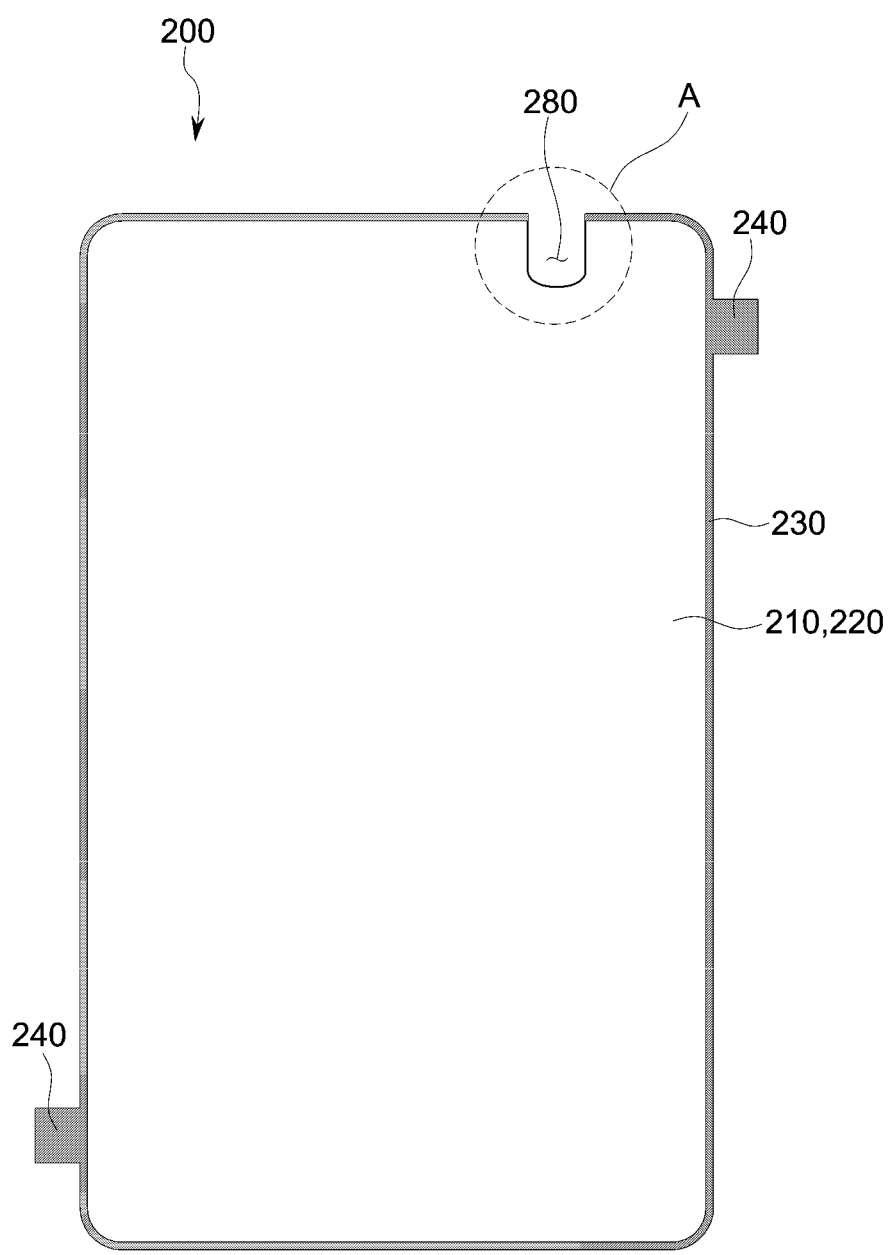
FIG. 9 is a plan view illustrating an outer protection film according to another embodiment.
Figure 10:
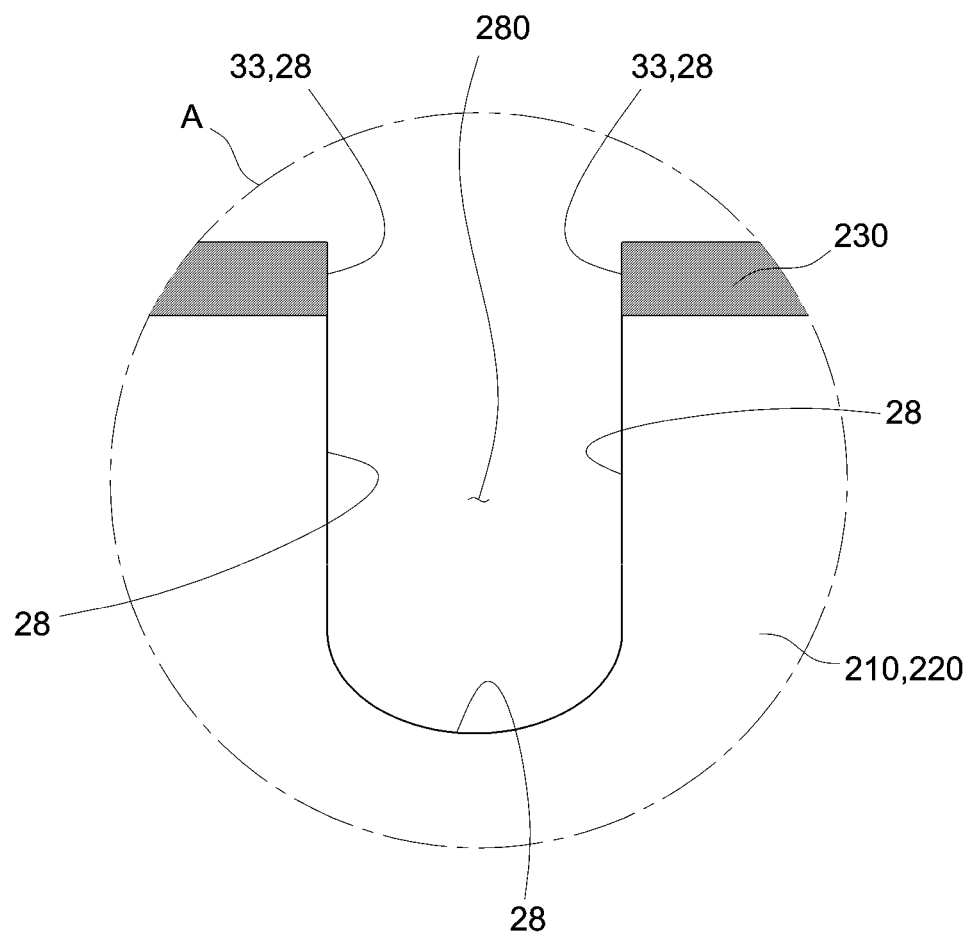
FIG. 10 is an enlarged view illustrating a region "A" in FIG. 9.

FIG. 9 is a plan view illustrating an outer protection film according to another embodiment; and FIG. 10 is an enlarged view illustrating a region "A" in FIG. 9.

As illustrated in FIGS. 9 and 10, in an embodiment, a protection layer 210 and an adhesive layer 220 of an outer protection film 200 may have a groove 280 that has a U-like shape. The groove 280 that has a U-like shape may be located corresponding to a securing unit 400, as described above. Accordingly, interference between a barrier wall 230 and the securing unit 400 may be prevented or substantially minimized.

In such an embodiment, the barrier wall 230 may be disposed along an outer edge of the protection layer 210. In other words, the barrier wall 230 may be disposed along the outer edge of the protection layer 210, other than an inner edge 28 of the protection layer 210.

Figure 11:
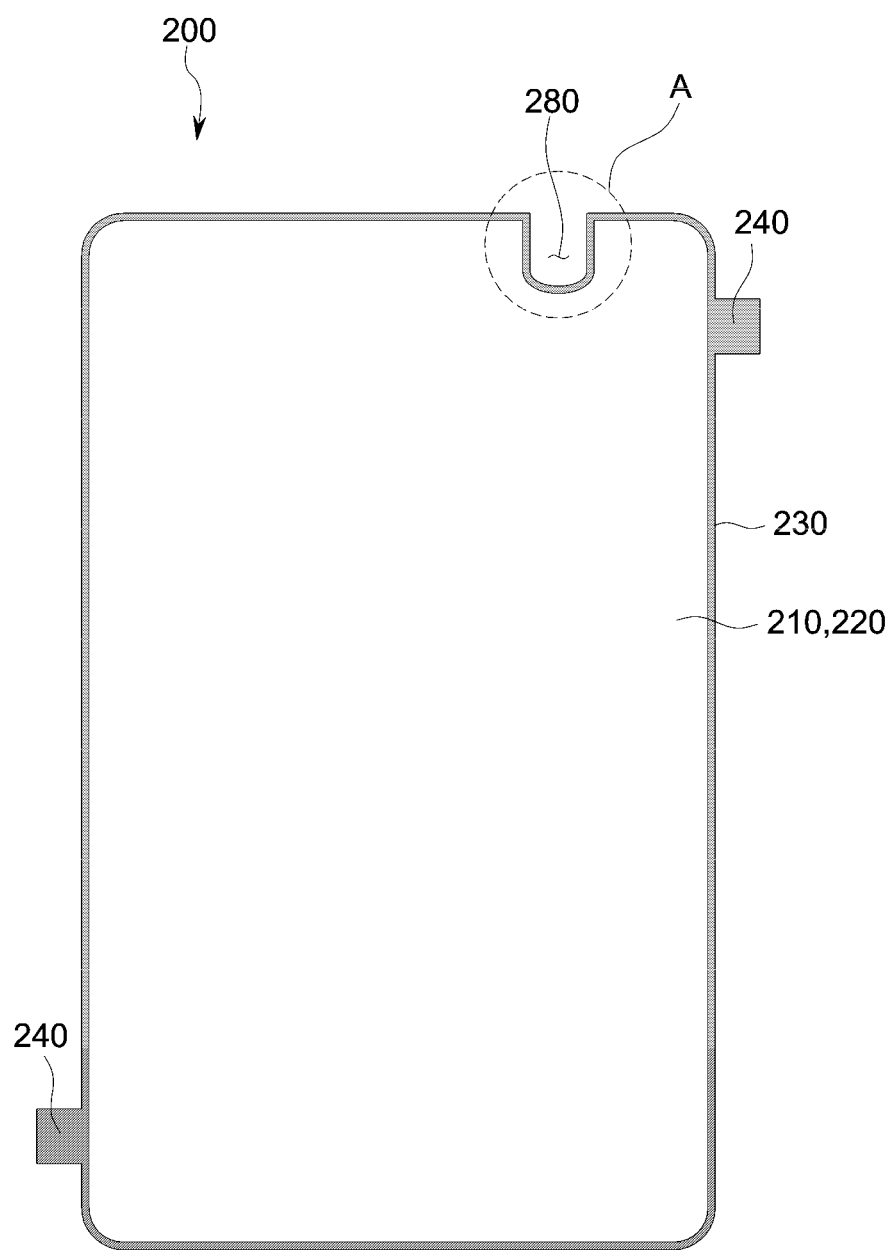
FIG. 11 is a plan view illustrating an outer protection film according to another embodiment.
Figure 12:
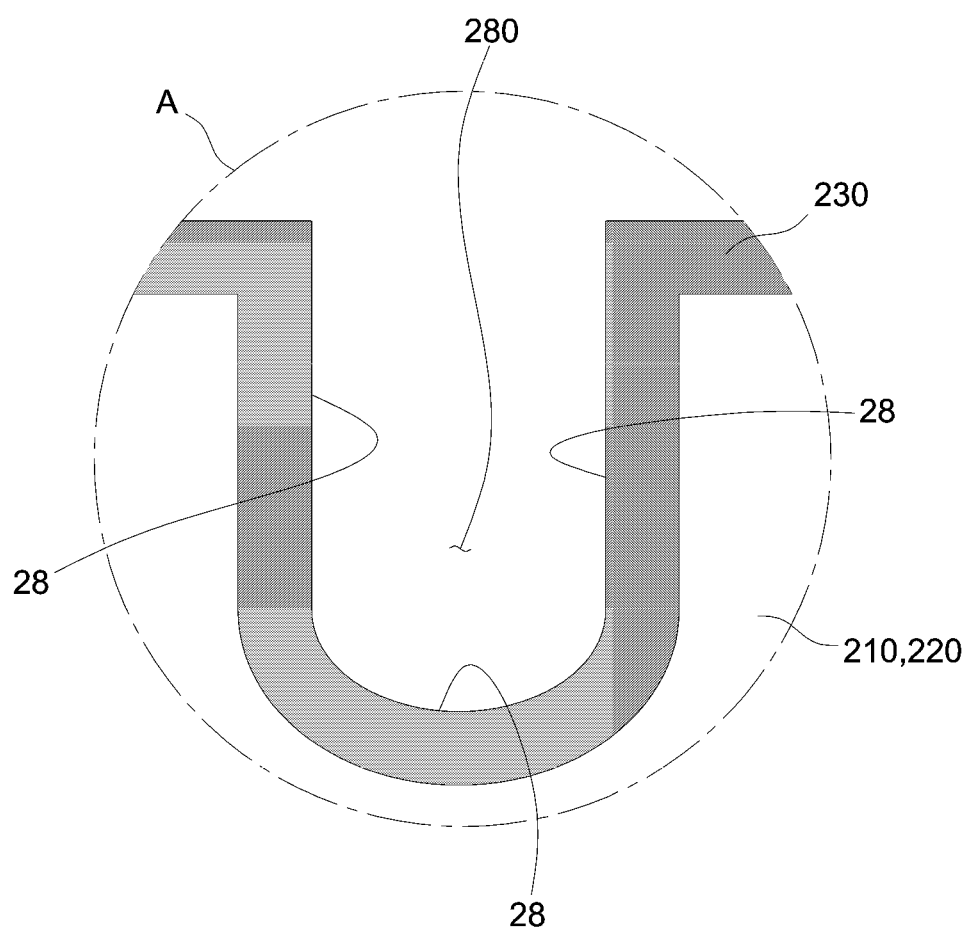
FIG. 12 is an enlarged view illustrating a region "A" in FIG. 11.

FIG. 11 is a plan view illustrating an outer protection film 200 according to another embodiment; and FIG. 12 is an enlarged view illustrating a region "A" in FIG. 11.

As illustrated in FIGS. 11 and 12, in an embodiment, a protection layer 210 and an adhesive layer 220 of an outer protection film 200 may have a groove 280 that has a U-like shape. The groove 280 that has a U-like shape may be located corresponding to a securing unit 400, as described above. Accordingly, interference between a barrier wall 230 and the securing unit 400 may be prevented or substantially minimized.

In such an embodiment, the barrier wall 230 may be disposed along an inner edge 28 that defines the groove 280 of the protection layer 210, in addition to an outer edge of the protection layer 210. In other words, the barrier wall 230 may be disposed along the outer edge and the inner edge 28 of the protection layer 210. Such a barrier wall 230 may have a closed-loop shape.

Figure 13:
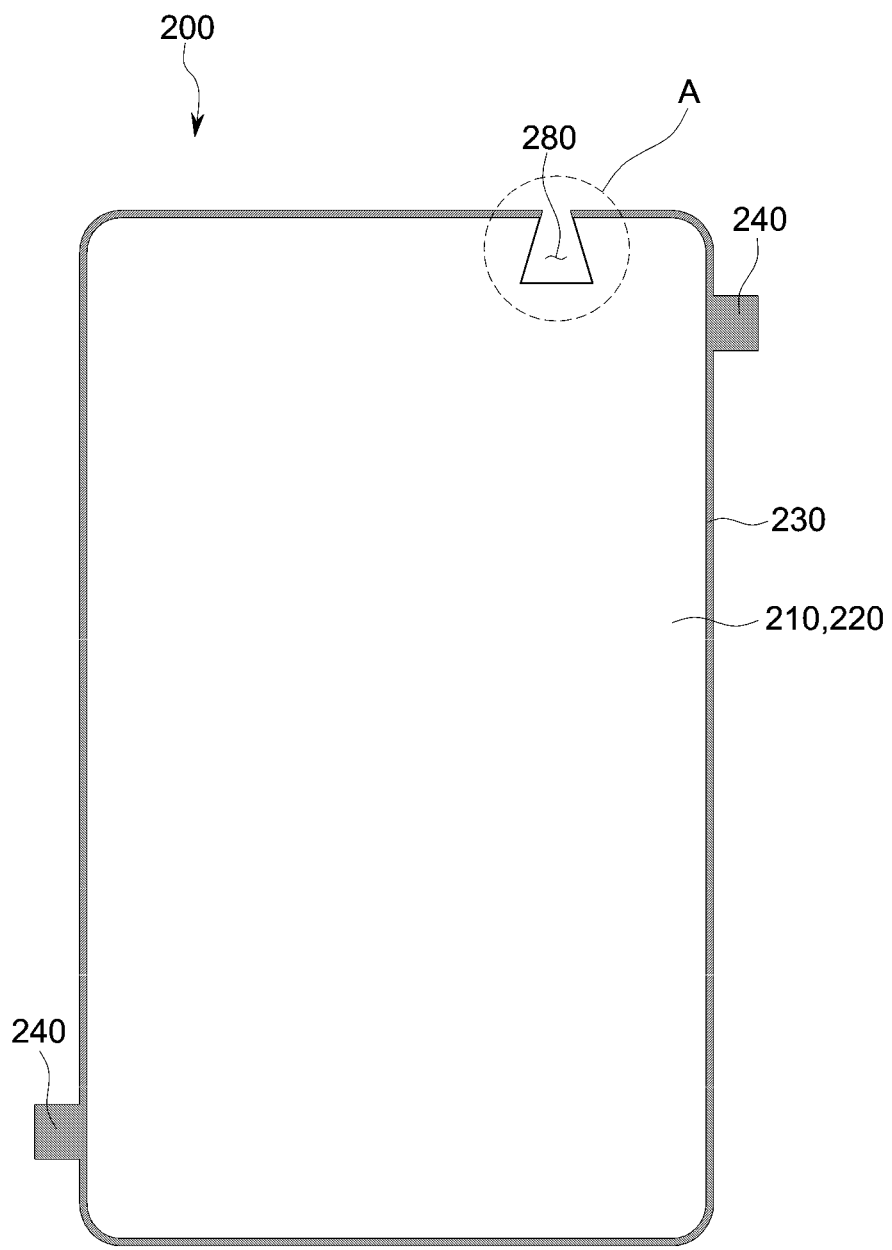
FIG. 13 is a plan view illustrating an outer protection film according to another embodiment.
Figure 14:
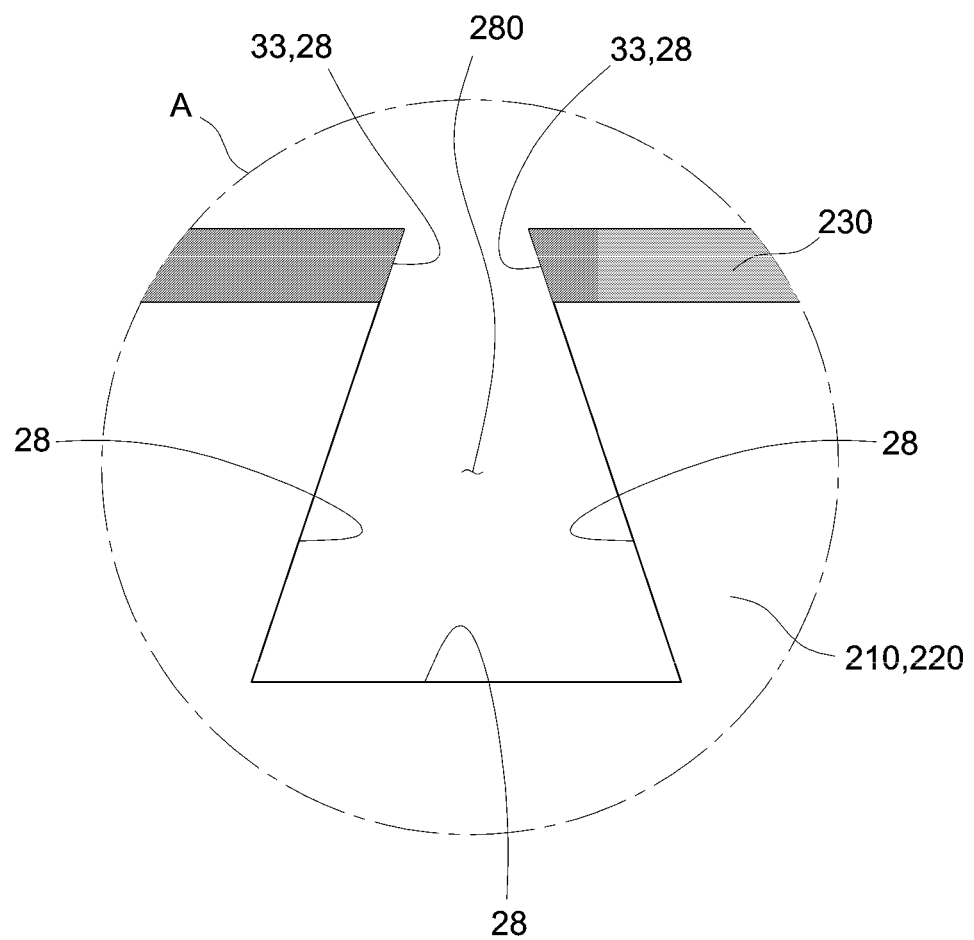
FIG. 14 is an enlarged view illustrating a region "A" in FIG. 13.

FIG. 13 is a plan view illustrating an outer protection film according to another embodiment; and FIG. 14 is an enlarged view illustrating a region "A" in FIG. 13.

As illustrated in FIGS. 13 and 14, in an embodiment, a protection layer 210 and an adhesive layer 220 of an outer protection film 200 may have a groove 280 that has a trapezoidal shape. The groove 280 that has a trapezoidal shape may be located corresponding to a securing unit 400, as described above.

In such an embodiment, a barrier wall 230 may be disposed along an outer edge of the protection layer 210. In other words, the barrier wall 230 may be disposed along the outer edge of the protection layer 210, other than an inner edge 28 of the protection layer 210.

Figure 15:
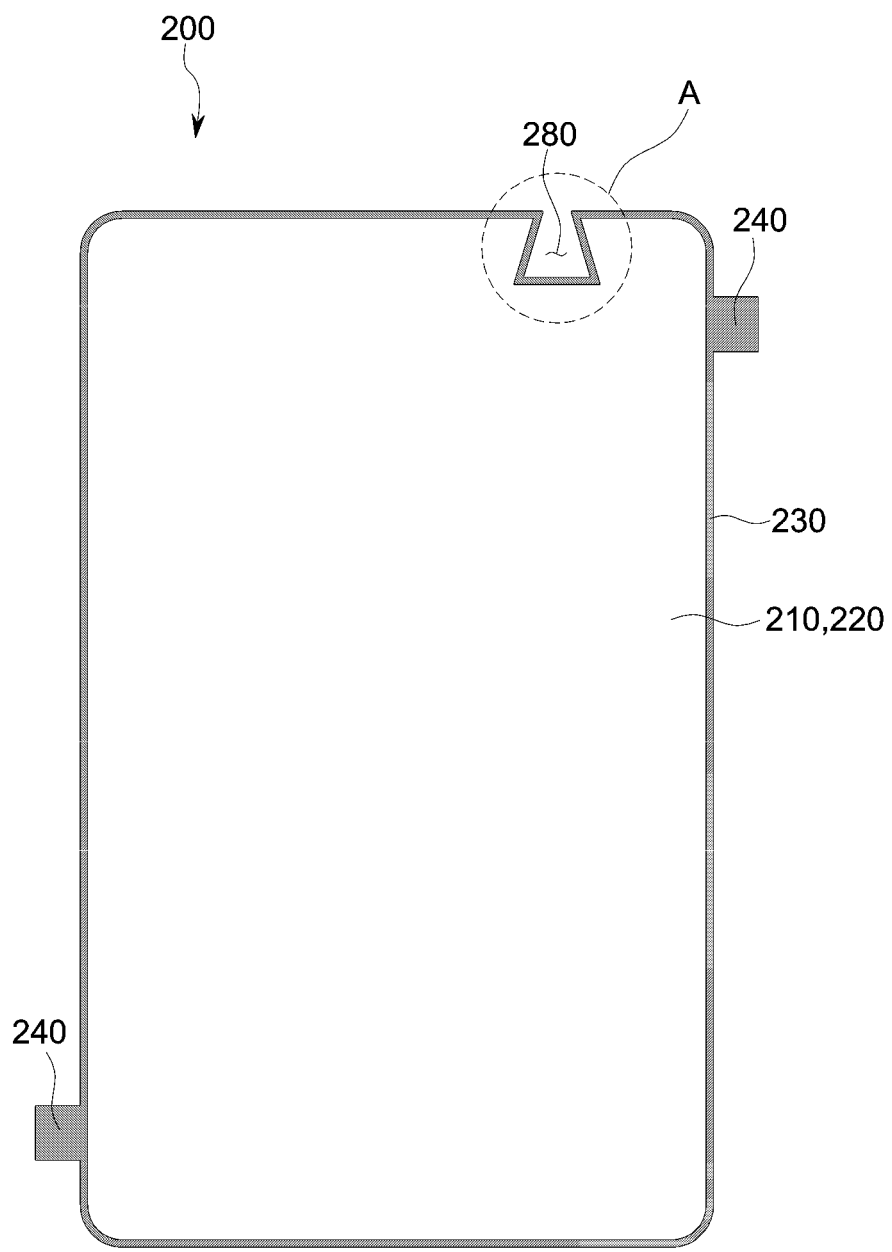
FIG. 15 is a plan view illustrating an outer protection film according to another embodiment.
Figure 16:
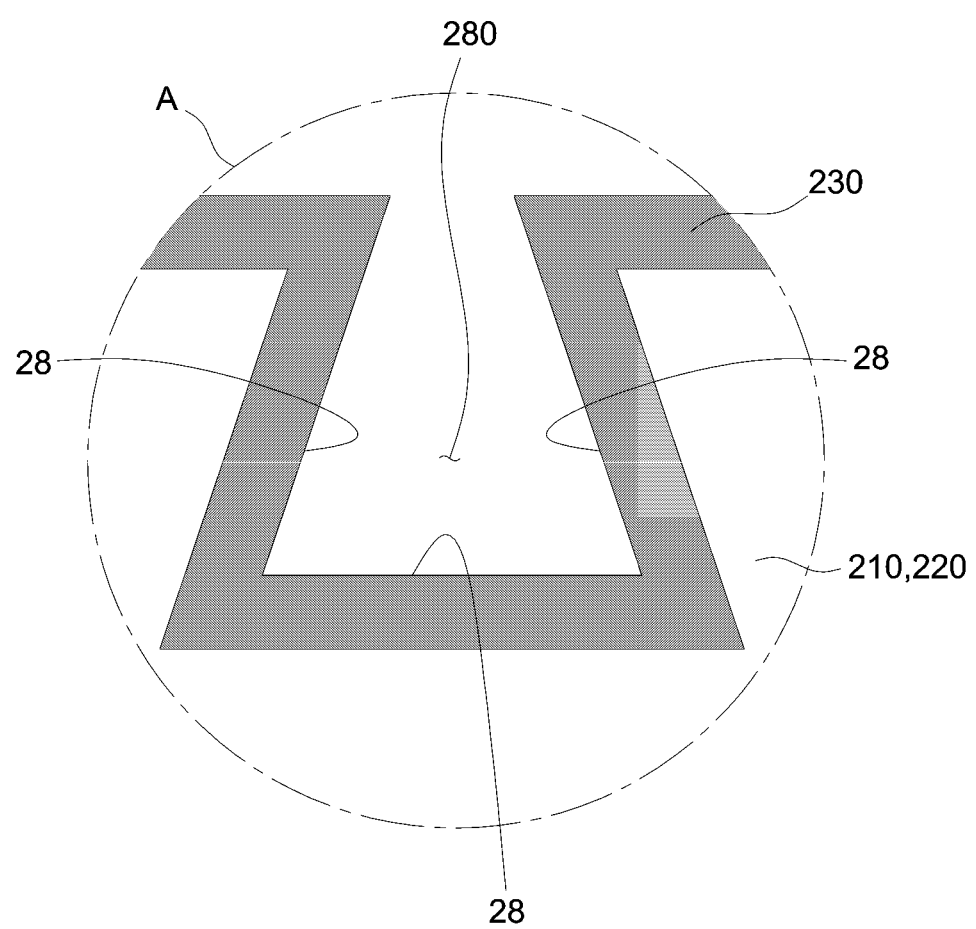
FIG. 16 is an enlarged view illustrating a region "A" in FIG. 15.

FIG. 15 is a plan view illustrating an outer protection film according to another embodiment; and FIG. 16 is an enlarged view illustrating a region "A" in FIG. 15.

As illustrated in FIGS. 15 and 16, in an embodiment, a protection layer 210 and an adhesive layer 220 of an outer protection film 200 may have a groove 280 that has a trapezoidal shape. The groove 280 that has a trapezoidal shape may be located corresponding to a securing unit 400, as described above.

In such an embodiment, a barrier wall 230 may be disposed along an inner edge 28 that defines the groove 280 of the protection layer 210, in addition to an outer edge of the protection layer 210. In other words, the barrier wall 230 may be disposed along the outer edge and the inner edge 28 of the protection layer 210. Such a barrier wall 230 may have a closed-loop shape.

Figure 17:
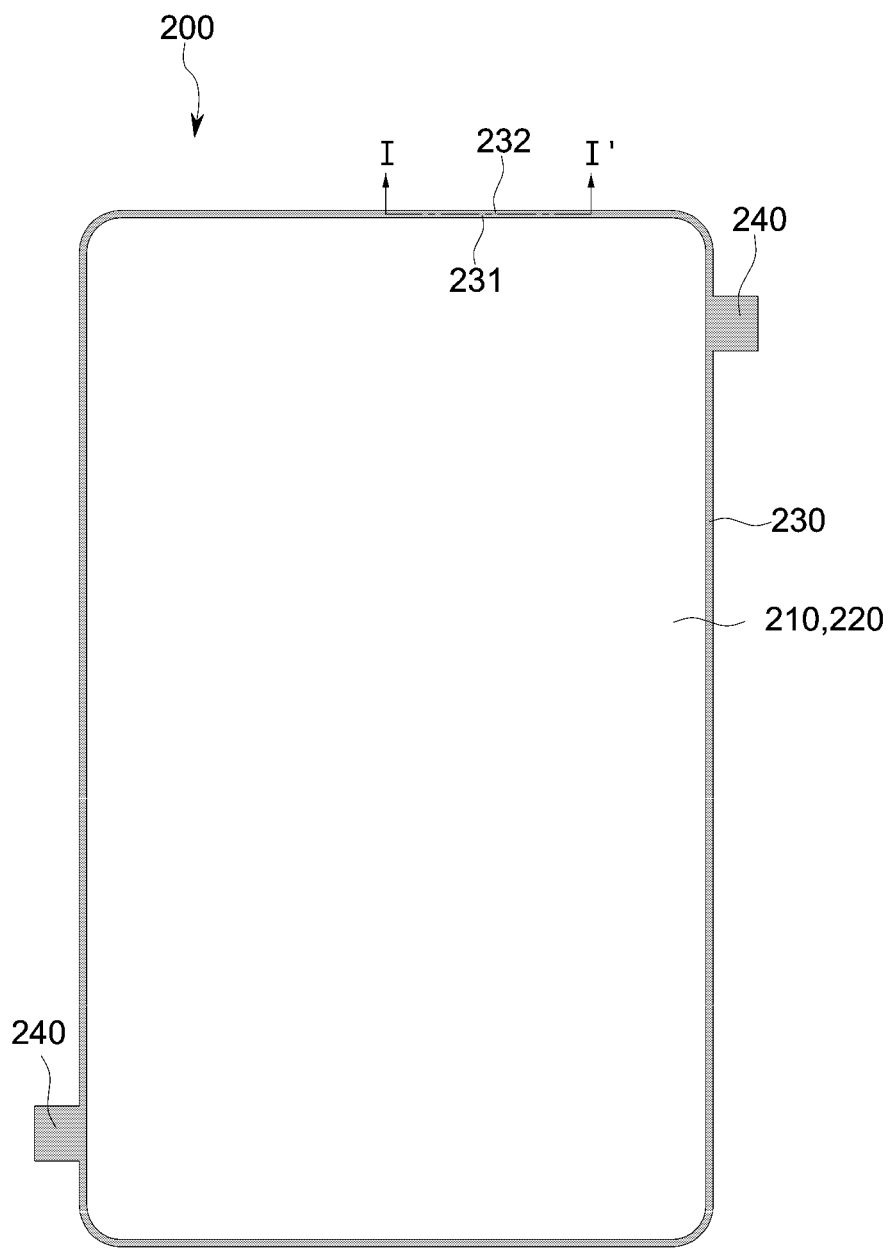
FIG. 17 is a plan view illustrating an outer protection film according to another embodiment.
Figure 18:
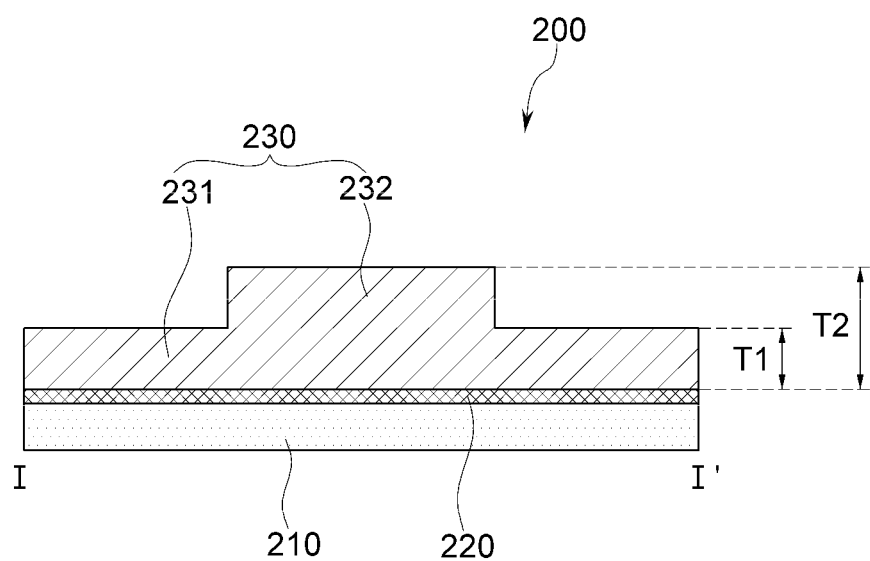
FIG. 18 is a cross-sectional view taken along the line I-I' in FIG. 17.

FIG. 17 is a plan view illustrating an outer protection film according to another embodiment; and FIG. 18 is a cross-sectional view taken along the line I-I' in FIG. 17.

As illustrated in FIGS. 17 and 18, an outer protection film 200 may include a protection layer 210, an adhesive layer 220, and a barrier wall 230.

The barrier wall 230 may have a closed-loop shape that surrounds an edge of the protection layer 210. In such an embodiment, a portion of the barrier wall 230 may have a thickness that is greater than a thickness of another portion of the barrier wall 230. For example, the barrier wall 230 may include a first barrier wall 231 having a first thickness T1 and a second barrier wall 232 having a second thickness T2 that is greater than the first thickness T1. The second barrier wall 232 that is relatively large in thickness may be disposed corresponding to a securing unit 400 of the window 100. In other words, the second barrier wall 232 may be disposed to overlap the securing unit 400. The second barrier wall 232 may be disposed to overlap a securing groove 44 of the securing unit 400. In such an embodiment, the thickness T2 of the second barrier wall 232 is greater than a size of the securing groove 44 of the securing unit 400. Accordingly, the second barrier wall 232 located corresponding to the securing unit 400 may not be inserted into the securing groove 44. Accordingly, when the window in the storage box 900 is lifted up, damage to the securing unit 400 may be prevented or substantially prevented.

Figure 19:
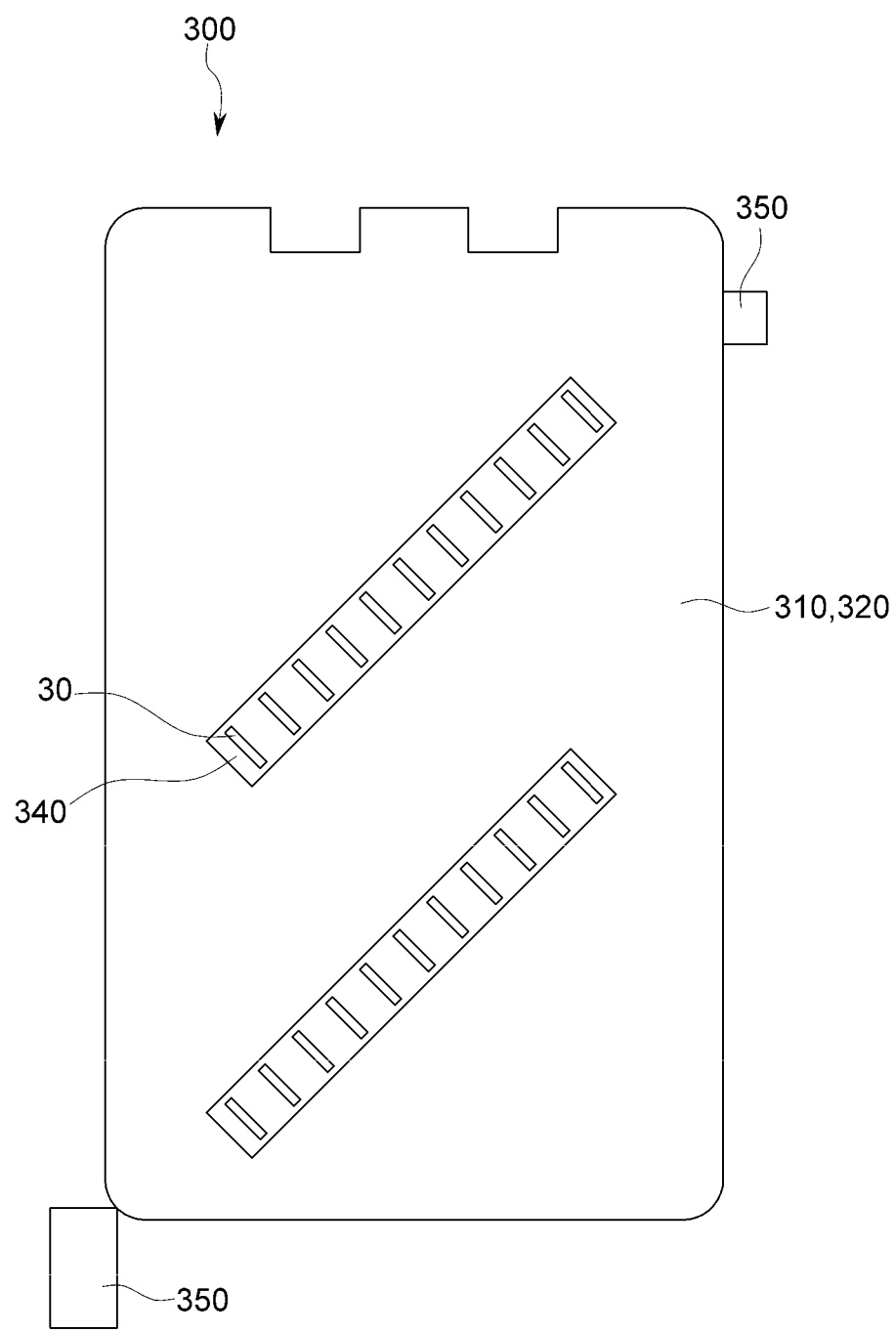
FIG. 19 is a plan view illustrating an inner protection film according to an embodiment.
Figure 20:
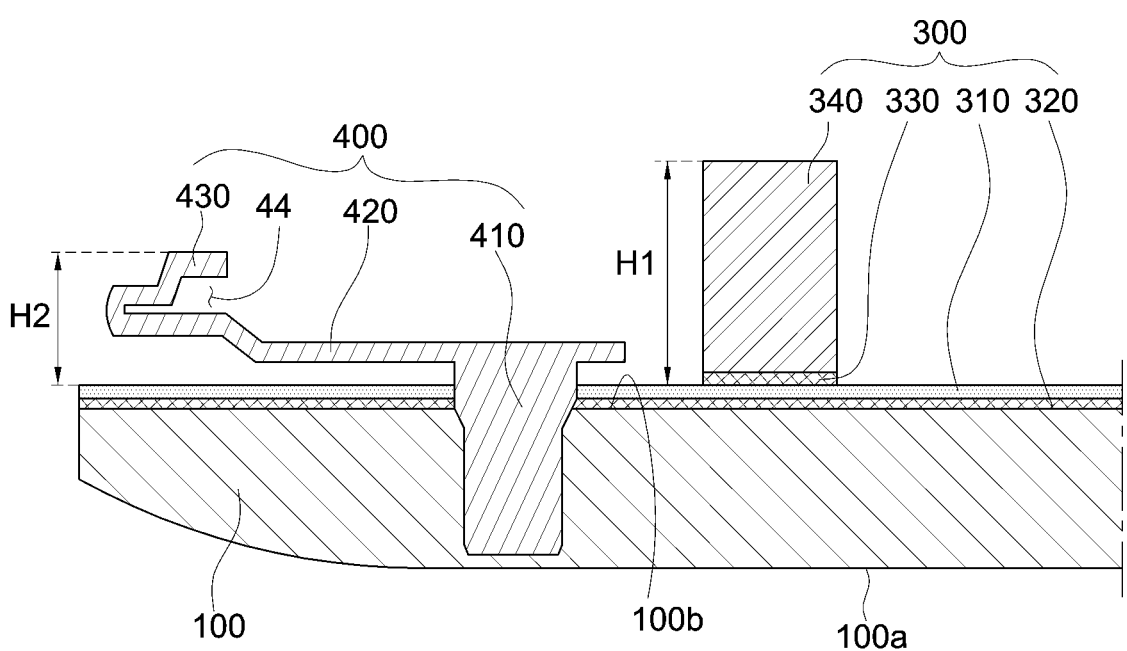
FIG. 20 is an explanatory view illustrating a height difference between a spacer of an inner protection film and a securing unit of a window.

FIG. 19 is a plan view illustrating an inner protection film 300 according to an embodiment; and FIG. 20 is an explanatory view illustrating a height difference between a spacer 340 of an inner protection film 300 and a securing unit 400 of a window 100.

An inner protection film 300 may include a protection layer 310, a first adhesive layer 320, a second adhesive layer 330, and a spacer 340, as illustrated in FIGS. 19 and 20. As illustrated in FIG. 20, the first adhesive layer 320 is disposed between an inner surface 100b of a window 100 and the protection layer 310, and the second adhesive layer 330 is disposed between the protection layer 310 and the spacer 340.

As illustrated in FIG. 19, in an embodiment, the spacers 340 may be arranged in an oblique direction. The spacers 340 in a set may be connected to each other. In such an embodiment, a hole 30 may be defined between the spacers 340 in a set that are arranged in an oblique direction. The inner protection film 300 is to be removed in an oblique direction. In such an embodiment, the spacers 340 in a set are arranged in the oblique direction such that the inner protection film 300 may be removed more easily. In addition, since the hole 30 is defined between adjacent ones of the spacers 340, the inner protection film 300 may be removed more easily.

The inner protection film 300 that is attached to the window 100 may be removed through the use of a handle 350. For example, an operator may remove the inner protection film 300 by pulling the handle 350, located at a lower left corner of the inner protection film 300, in an oblique direction while holding the handle 350 by hand.

As illustrated in FIG. 20, a height H1 of the spacer 340 is higher than a height H2 of a securing unit 400. Specifically, the height H1 of the spacer 340 measured with respect to the protection layer 310 of the inner protection film 300 is higher than the height H2 of the securing unit 400 measured with respect to the protection layer 310. Accordingly, interference between a barrier wall 230 and a securing unit 400 of windows in a protection box 900 that face each other may be prevented or substantially minimized.

Figure 21:
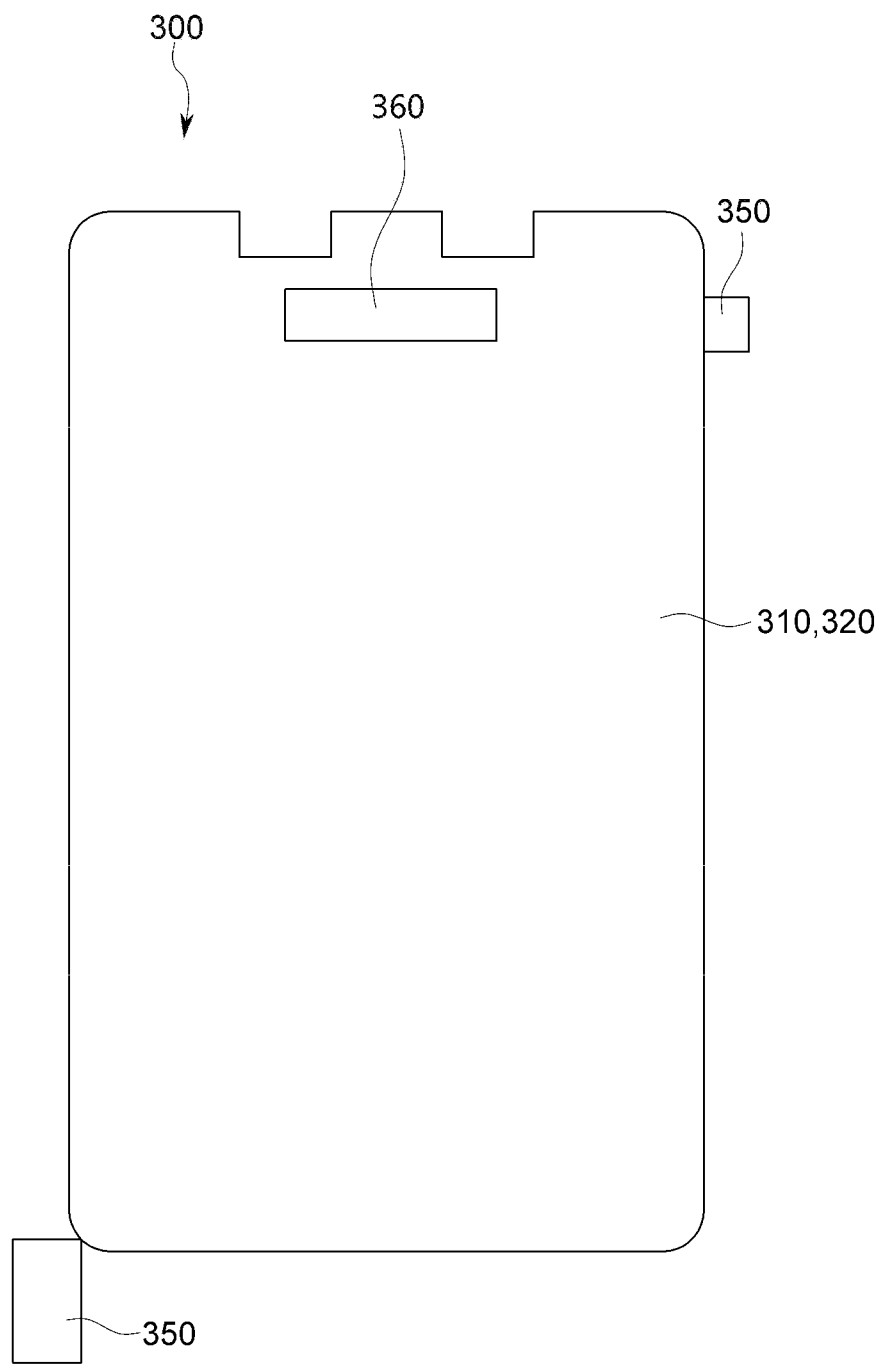
FIG. 21 is a plan view illustrating an inner protection film according to another embodiment.

FIG. 21 is a plan view illustrating an inner protection film 300 according to another embodiment.

As illustrated in FIG. 21, in an embodiment, a spacer 360 may be disposed at or near an edge of an inner protection film 300. For example, the spacer 360 may be disposed at or near an edge of the inner protection film 300 that is adjacent to a securing unit 400. In such an embodiment, the spacer 360 may be disposed in a horizontal direction.

A height of the spacer 360 is higher than a height H2 of the securing unit 400. Specifically, the height of the spacer 360 measured with respect to a protection layer 310 of the inner protection film 300 is higher than the height H2 of the securing unit 400 measured with respect to the protection layer 310.

Figure 22:
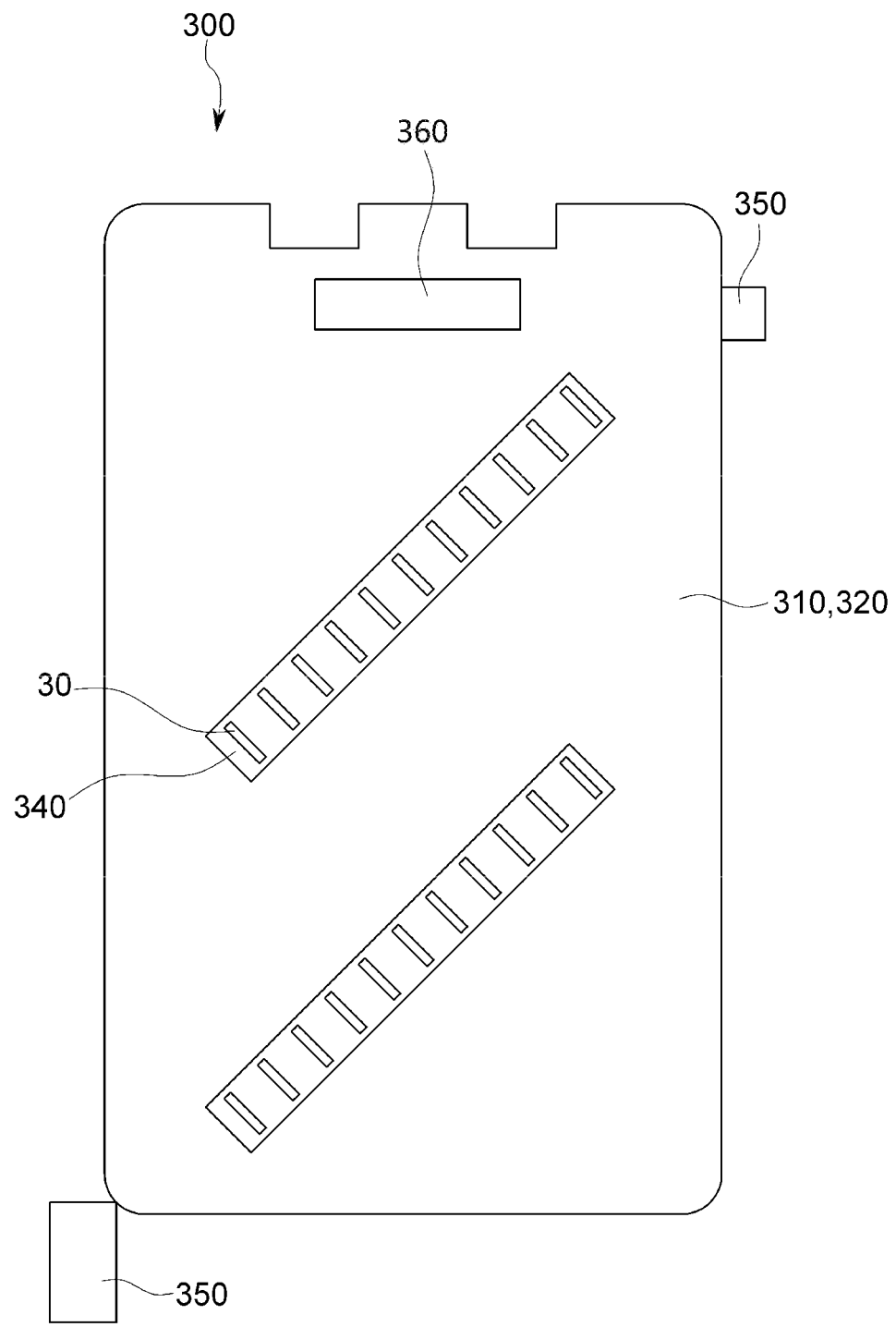
FIG. 22 is a plan view illustrating an inner protection film according to another embodiment.

FIG. 22 is a plan view illustrating an inner protection film 300 according to another embodiment.

As illustrated in FIG. 22, in an embodiment, an inner protection film 300 may include the spacer 340 of FIG. 20 and the spacer 360 of FIG. 21.

As set forth herein, a protection film for a window according to one or more embodiments of the present invention may prevent or substantially prevent damage to a securing unit of the window.

While the present invention has been illustrated and described with reference to some embodiments thereof, it will be apparent to those of ordinary skill in the art that various changes in form and detail may be made thereto without departing from the spirit and scope of the present invention.

What is claimed is:
1. A protection film for a window of a display device, the protection film comprising:
   a protection layer; and
   a barrier wall on the protection layer, the barrier wall overlapping the protection layer in a first direction,
   wherein the protection layer has a groove at an edge of the protection layer,
   the edge of the protection layer comprises an inner edge defining the groove, and an outer edge, the barrier wall is disposed along the outer edge of the protection layer, the barrier wall is not disposed on the inner edge, the protection layer and the barrier wall are stacked in the first direction, the groove is depressed along a second direction crossing the first direction, and the protection layer further comprises at least one dummy layer extending from the inner edge of the protection layer and disposed at the groove, and the at least one dummy layer and the protection layer are integrally formed into a unitary structure.

2. The protection film for a window of a display device as claimed in claim 1, wherein the barrier wall has a closed-loop shape that encloses a center portion of the protection layer.

3. The protection film for a window of a display device as claimed in claim 1, wherein the groove has a U-like shape or a trapezoidal shape.

4. The protection film for a window of a display device as claimed in claim 1, wherein the groove is located corresponding to a securing unit of the window of the display device.

5. The protection film for a window of a display device as claimed in claim 1, further comprising a handle extending from the barrier wall outwardly of the protection film.

6. The protection film for a window of a display device as claimed in claim 1, further comprising an adhesive layer on the protection layer.

7. The protection film for a window of a display device as claimed in claim 6, wherein a portion of the adhesive layer is disposed between the protection layer and the barrier wall.

8. The protection film for a window of a display device as claimed in claim 1, further comprising an adhesive layer on the protection layer, the adhesive layer being exposed through an opening of the barrier wall.

9. The protection film for a window of a display device as claimed in claim 1, wherein, in a plan view as viewed along the first direction, the edge of the protection layer defines an outer perimeter of the protection layer.

10. The protection film for a window of a display device as claimed in claim 1, wherein the first direction is a direction of a thickness of the protection layer that is less than a length of the protection layer along an outer perimeter of the protection layer in the second direction.

* * * * *